United States Patent [19]

Matsuoka et al.

[11] Patent Number: 5,012,448

[45] Date of Patent: * Apr. 30, 1991

[54] SENSE AMPLIFIER FOR A ROM HAVING A MULTILEVEL MEMORY CELL

[75] Inventors: Shigeki Matsuoka, Suita; Hiizu Okubo, Nishinomiya; Daisuke Kosaka, Takarazuka, all of Japan

[73] Assignee: Ricoh Company, Ltd., Tokyo, Japan

[*] Notice: The portion of the term of this patent subsequent to Jun. 14, 2002 has been disclaimed.

[21] Appl. No.: 220,976

[22] Filed: Jul. 15, 1988

Related U.S. Application Data

[62] Division of Ser. No. 940,017, Dec. 10, 1986, abandoned.

[30] Foreign Application Priority Data

Dec. 13, 1985 [JP] Japan ................. 60-280567
Sep. 25, 1986 [JP] Japan ................. 61-227396

[51] Int. Cl.[5] ............................... G11C 17/18
[52] U.S. Cl. ........................... 365/208; 365/169; 365/104; 365/210; 365/184; 307/530
[58] Field of Search ............. 365/207, 208, 168, 104, 365/184, 210; 307/530

[56] References Cited

U.S. PATENT DOCUMENTS

| | | | |
|---|---|---|---|
| 4,287,570 | 9/1981 | Stark | 365/104 |
| 4,376,987 | 3/1983 | Hsia | 365/184 |
| 4,388,702 | 6/1983 | Sheppard | 365/104 |
| 4,488,065 | 12/1984 | Doty, II | 307/530 |
| 4,604,732 | 8/1986 | van Tran | 365/207 |
| 4,751,682 | 6/1988 | Matsuoka et al. | 365/208 |

OTHER PUBLICATIONS

Donoghue et al., "A 256K HCMOS ROM Using A Four-State Cell Approach", IEEE Jour. of Sol. St. Cets., vol. SC-20, No. 2, Apr. 1985, pp. 598–602.

Primary Examiner—Glenn Gossage
Attorney, Agent, or Firm—Cooper & Dunham

[57] ABSTRACT

A multilevel sense circuit includes a memory MOSFET having one of at least two different current carrying states and a pair of reference MOSFETs one of which has one of the two current carrying states and the other of which has the other current carrying state. A first current supplying circuit is connected to the memory MOSFET for supplying a predetermined amount of current thereto when the memory MOSFET is activated. A second current supplying circuit is connected to the pair of reference MOSFETs and also to the first current supplying circuit, such that twice the aforementioned predetermined amount of current is supplied to the pair of reference MOSFETs when the memory MOSFET is activated. A multilevel semiconductor memory device includes a MOSFET having a channel whose width is varyingly set by providing a non-inverting region in a selected area of the channel by ion implantation.

7 Claims, 6 Drawing Sheets

STATE "00" $Q_A$ $Q_B$ "01"

$Q_C$ "10"

$Q_D$ "11"

IMPLANTED REGION

SENSE AMPLIFIER FOR A ROM HAVING A MULTILEVEL MEMORY CELL

This is a division of application Ser. No. 940,017 filed Dec. 10, 1986, now abandoned.

BACKGROUND OF THE INVENTION

1. Field of the Invention

This invention generally relates to a semiconductor device, and, in particular, to a semiconductor memory device. More specifically, the present invention relates to a sense circuit for use in a semiconductor memory device, such as a read only memory or simply ROM, and to a MOS transistor suitable for use in a semiconductor memory device.

2. Description of the Prior Art

A semiconductor memory device, such as a ROM, is well known in the art. In a ROM, typically, two levels of current, $I_1$ and $I_2$, flow through a memory cell, and it is necessary to determine which level of current flows through a selected one of memory cells arranged in the form of a matrix. In order to determine the level of current flowing through a selected memory cell, there is typically provided a reference cell, through which current having the level of approximately $(I_1+I_2)/2$ flows, and this current level is compared with the current level of the selected memory cell. In this case, it is required to create two different states for a memory cell and one state for the reference cell, so that the total number of states required is three.

FIG. 3 shows a prior art example for the case in which a memory can take one of four states as disclosed in IEEE Journal of Solid-State Circuits, Vol. SC-20, No. 2, pp 598–602, April 1985, which is hereby incorporated by reference. As shown in FIG. 3, there is provided a memory cell M1 which can take one of four states different in level. In other words, under a predetermined bias condition, the level of current flowing through the memory cell M1 is one of four different cases, i.e., $I_1$, $I_2$, $I_3$ and $I_4$ with the current level increasing gradually in the order as mentioned. Also provided are reference memory cells R1 through R3 and bias circuits 2-1 through 2-4 which provide the same bias condition to the memory cell M1 and the reference cells R1 through R3. It is structured so that the level of current flowing through the reference cell R1 is set between $I_1$ and $I_2$, the level of current flowing through the reference cell R2 is set between $I_2$ and $I_3$ and the level of current flowing through the reference cell R3 is set between $I_3$ and $I_4$.

The structure shown in FIG. 3 also includes three sense amps 4-1 through 4-3, each of which is connected to compare the drain voltage of the memory cell M1 and the drain voltage of each of the corresponding reference cells R1 through R3 so as to detect the state of the memory cell M1. In this prior art structure, it is required to create three states for each of the reference cells R1 through R3 in order to determine the state of the memory cell M1 in addition to the four states for the memory cell M1. In general, if it is desired to detect one of a number of possible states of a memory cell, it is required to create (n-1) number of states for the reference cells. As a result, in total, it is typically required to create (2n-1) number of states in a memory device. Accordingly, such a requirement would provide an undue difficulty in manufacturing a memory device and manufacture of a memory device can be done only with a low yield.

SUMMARY OF THE INVENTION

In accordance with one aspect of the present invention, there is provided a sense circuit suitable for use in a semiconductor memory device, which only requires n total number of states both for the memory and reference cells so as to detect one of n possible number of states which can be taken by each of the memory cells. In accordance with another aspect of the present invention, there is provided a MOSFET having a channel whose width is regulated by an ion implanted region. Such a MOSFET having a width-adjusted channel can be used as a multilevel valued transistor suitable for use as a memory element in a semiconductor memory circuit, such as a ROM.

It is therefore a primary object of the present invention to obviate the disadvantages of the prior art as described above and to provide an improved semiconductor memory device.

Another object of the present invention is to provide an improved read only memory (ROM) having a high packing density.

A further object of the present invention is to provide an improved sense amplifier suitable for use in a semiconductor memory device.

A still further object of the present invention is to provide a MOS transistor having a channel of well-defined width suitable for use in a semiconductor memory device.

A still further object of the present invention is to provide a multilevel MOSFET suitable for use as a memory cell of a ROM.

Other objects, advantages and novel features of the present invention will become apparent from the following detailed description of the invention when considered in conjunction with the accompanying drawings.

DESCRIPTION OF THE PREFERRED EMBODIMENTS

Figure 1:
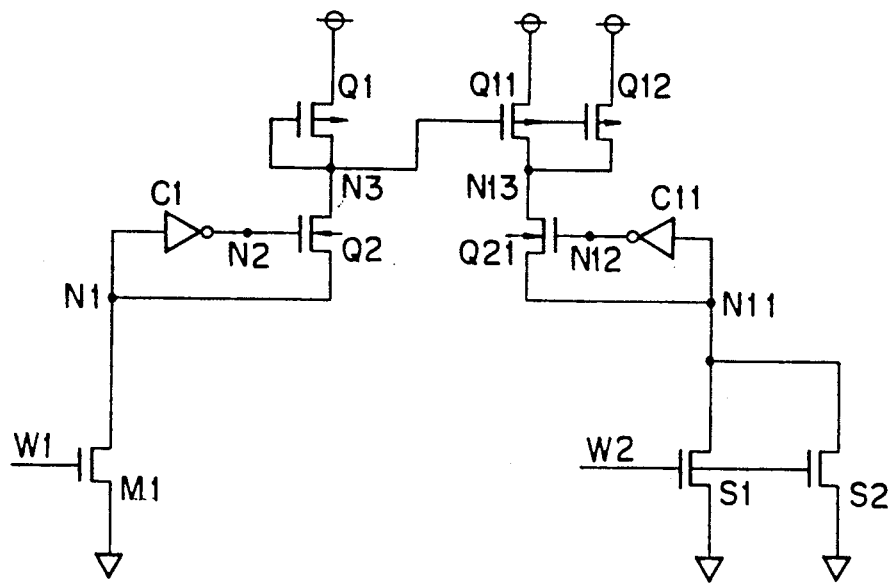
FIG. 1 is a circuit diagram showing a multilevel sense circuit constructed in accordance with one embodiment of the present invention.
Figure 3:
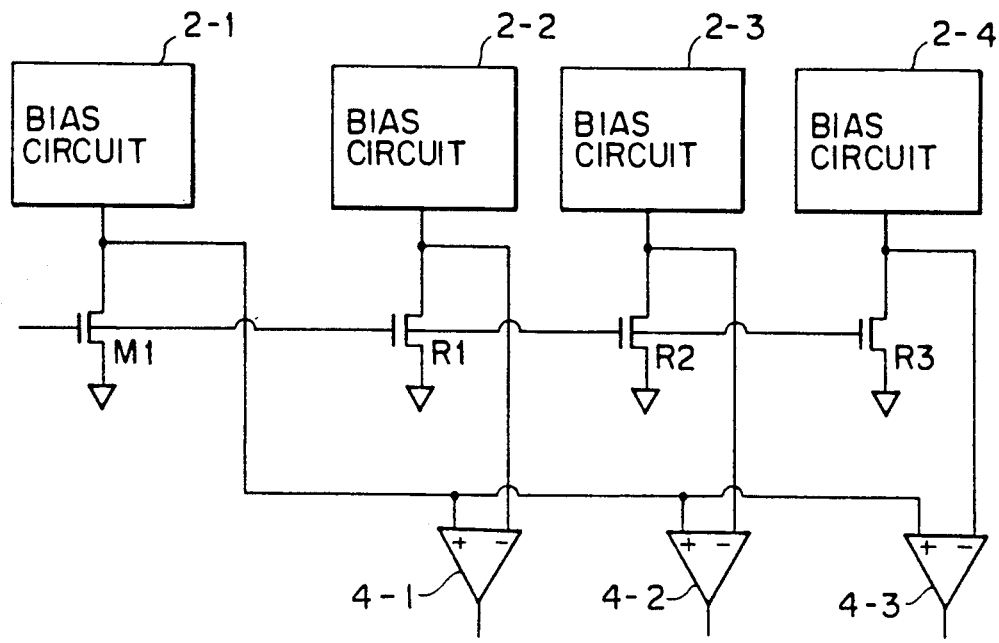
FIG. 3 is a circuit diagram showing a typical prior art multilevel sense circuit.

Referring now to FIG. 1, there is schematically shown a multilevel sense circuit constructed in accordance with one embodiment of the present invention. As shown, the illustrated sense circuit includes a memory transistor or cell M1, which is preferably comprised of a MOSFET, through which either one of two different levels of current $I_1$ and $I_2$ flow with its gate and drain electrodes at predetermined voltages. The memory transistor M1 has its drain connected to the source of an NMOS transistor Q2 and also to the input of an inverter C1 whose output is connected to the gate of the NMOS transistor Q2. The drain of the NMOS transistor Q2 is connected to the drain of a PMOS transistor Q1 which has its source connected to a power supply voltage $V_{cc}$ and its gate connected to its drain.

The sense circuit also includes a pair of reference transistors S1 and S2, each of which is preferably comprised of a MOSFET, and the levels of current flowing through the reference transistors S1 and S2 under the same voltage conditions at the gate and drain as those for the memory transistor M1 are $I_1$ and $I_2$, respectively. The reference transistors S1 and S2 receive a gate voltage at their gates W2, which is the same in level as a gate voltage received at a gate W1 of the memory transistor M1. The reference transistors S1 and S2 have their drains commonly connected at a common node N11. To the common node N11 is connected the input of a reference side inverter C11 having a transmission characteristic which is substantially the same as that of the memory side inverter C1. An NMOS transistor Q21 having substantially the same characteristic as that of the NMOS transistor Q2 is provided and its source is also connected to the common node N11. The NMOS transistor Q21 has its drain connected to the drain of each of a pair of PMOS transistors Q11 and Q12 whose sources are both connected to the power supply voltage $V_{cc}$ and whose gates are commonly connected to the gate and thus to the drain of the PMOS transistor Q1. It is thus so structured that the saturation current by a pair of PMOS transistors Q11 and Q12 is approximately twice the saturation current of the PMOS transistor Q1.

When the gate W1 of the memory transistor M1 is at the power supply voltage $V_{cc}$ and the voltage of its drain N1 is at the threshold voltage T1 of the inverter C1, the memory transistor M1 has one of the two states, i.e., current levels $I_1$ and $I_2$. Here, it is assumed that $I_1$ is smaller than $I_2$. On the other hand, when the gates W2 of the reference transistors S1 and S2 have the same voltage as that of the gate W1 of the memory transistor M1 and the voltage at the drain N11 is equal to the threshold voltage of the inverter C11, which is equal to the threshold voltage T1 of the inverter C1, the levels of current flowing through the reference transistors S1 and S2 are $I_1$ and $I_2$, respectively. It is to be noted that all of the PMOS transistors Q1, Q11 and Q12 have the same transistor characteristic.

Now, if the level of current flowing through the memory transistor M1 is assumed to be $I_1$, then the total saturation current level for the paired PMOS transistors Q11 and Q12 is equal to $2I_1$, which is smaller than a sum of the current $I_1+I_2$ flowing through the reference transistors S1 and S2 under the condition that the voltage at the node N11 is equal to the threshold voltage T1. That is, $2I_1$ is smaller than $I_1+I_2$. Accordingly, the PMOS transistors Q11 and Q12 operate in the saturated region to supply the current $2I_1$, and thus the voltage at the node N11 lowers until the current flowing through the reference transistors S1 and S2 become equal to $2I_1$. When this condition is reached, the voltage at the node N13 is equal to a sum of the voltage at the node N11 and the voltage drop across the NMOS transistor Q21. Assuming that the threshold voltage T1 is on the order of 1 V, the voltage at the node N13 approximately ranges from 1 V to 1.5 V.

Next, if the current flowing through the memory transistor M1 is $I_2$, then the total saturation current flowing through the pair of PMOS transistors Q11 and Q12 is equal to $2I_2$. This current $2I_2$ is larger than a sum of current $I_1+I_2$ flowing through the reference transistors S1 and S2 when the voltage at the node N11 is equal to the threshold voltage T1. That is, $2I_2$ is larger than $I_1+I_2$. Accordingly, the voltage at the node N13, to which the drains of the PMOS transistors Q11 and Q12 are commonly connected, increases so that the PMOS transistors Q11 and Q12 operate in the linear region, thereby supplying the total current of $I_1+I_2$. Under this condition, the voltage at the node N13 is between the power supply voltage and a sum of the voltage at the node N3 and the absolute value of $V_{tp}$. Here, $V_{tp}$ indicates the threshold voltage of each of the PMOS transistors Q11 and Q12. It is to be noted that the voltage at the node N3 may be set at a higher level if the driving power of the PMOS transistor Q1 is made larger. Under the conditions of $V_{cc}=5$ V, N3=4 V and $V_{tp}=-0.8$ V, the voltage at the node N13 is set between 4.8 V and 5 V. In addition, if the voltage at the node N3 is set higher, the current-voltage conversion process is carried out by the PMOS transistors Q11 and Q12 using the saturation region of these transistors, so that the current detecting accuracy is enhanced.

As described above, in accordance with the structure shown in FIG. 1, depending on whether the current flowing through the memory transistor M1 is $I_1$ or $I_2$, the voltage at the node N13 is determined to be either at low level or at high level. This fact can be used to sense or determine the status of the memory transistor M1.

Figure 2:
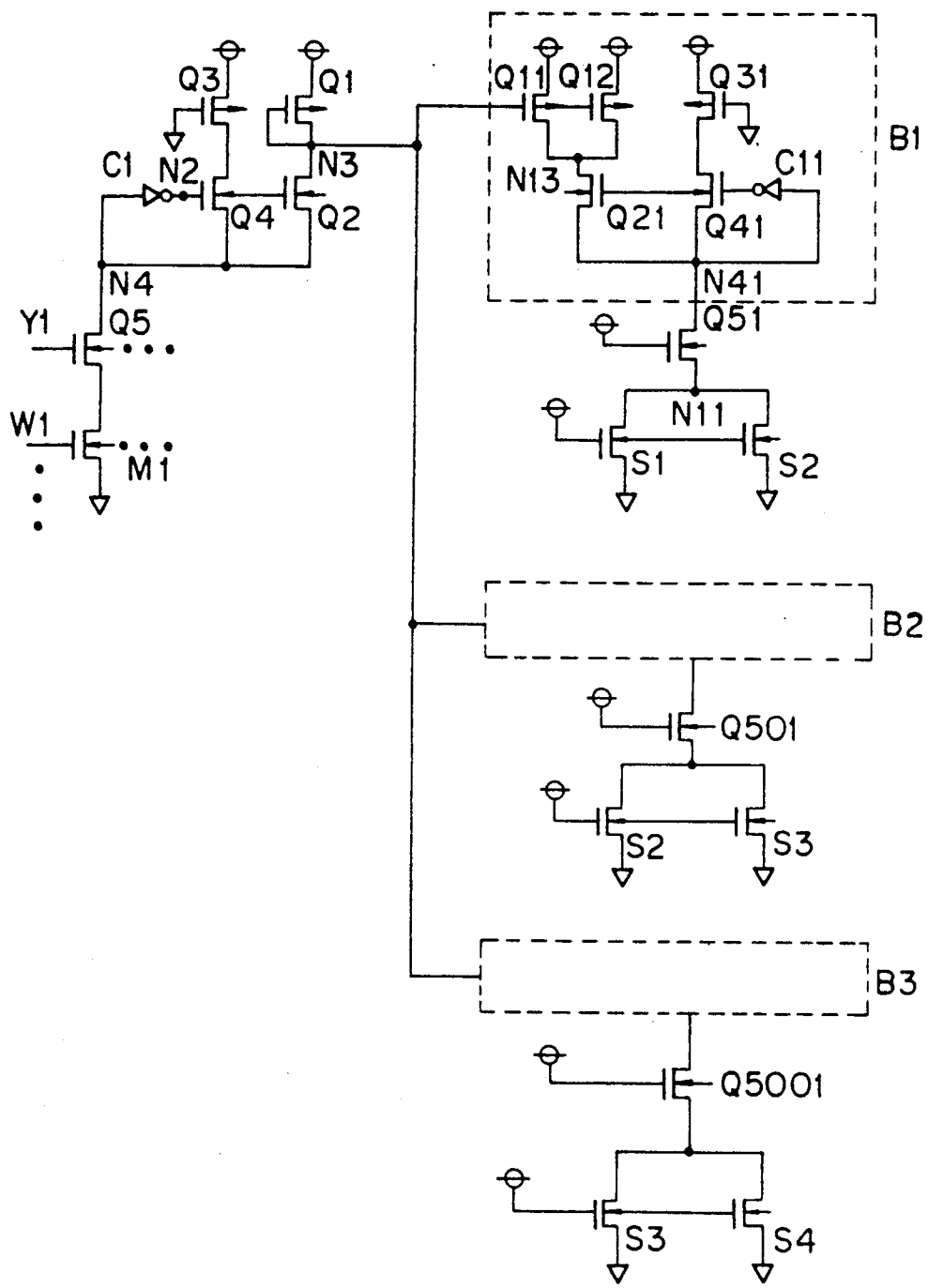
FIG. 2 is a circuit diagram showing another multilevel sense circuit constructed in accordance with another embodiment of the present invention.

FIG. 2 shows a multilevel sense circuit constructed in accordance with another embodiment of the present invention for detecting the state of a memory transistor having one of four possible states. In order to detect the state of the memory transistor M1, i.e., detecting the current flowing through the memory transistor M1 to be one of $I_1$, $I_2$, $I_3$ and $I_4$, there are provided reference transistors S1, S2, S3 and S4 which correspond to the four different states. Similarly in structure as in the case of FIG. 1, it is so structured that twice the current $I_x$ flowing through the memory transistor M1, i.e., $2I_x$, is compared with the reference current levels of $I_1+I_2$, $I_2+I_3$ and $I_3+I_4$.

The embodiment shown in FIG. 2 differs from the embodiment shown in FIG. 1 in that the memory transistor M1 is one of a plurality of similar memory transistors arranged in the form of a matrix and selectable by a word line W1 and a selection gate Q5 and that a pair of current supplying circuits, one of which is comprised of a PMOS transistor Q3 and an NMOS transistor Q41 and the other of which is comprised of a PMOS transistor Q31 and an NMOS transistor Q4, are provided in the bias circuits for the memory and reference transistors, respectively. With the addition of these current supplying circuits, for example, in the case where the PMOS transistors Q11 and Q12 operate in the saturation region, the current from these current supplying circuits can prevent the voltage at the node N11 from falling. As a result, the voltage difference between high and low levels at the node N11 may be made smaller, which, in turn, allows a high-speed sense operation. It is to be noted that, in the structure shown in FIG. 2, bias circuits indicated by B2 and B3 are identical in structure to the bias circuit B1.

As described above, in accordance with this aspect of the present invention, in order to detect the programmed state of a multilevel memory cell having one of n possible states, it is only necessary to provide reference cells to define such n possible states, so that a multilevel sense circuit can be manufactured with ease and high reliability.

Now, another aspect of the present invention will be described in detail below. This aspect of the present invention relates to a MOS transistor having a channel whose width is selectively determined during manufacture, and, thus, which is particularly suitable for use in a semiconductor memory device as a multilevel memory transistor.

Figure 9A:
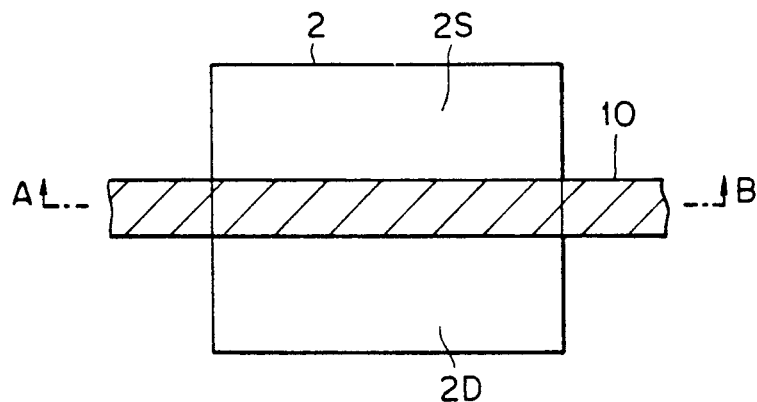
FIGS. 9a and 9b are schematic illustrations showing the structure of a typical prior art MOSFET.
Figure 9B:
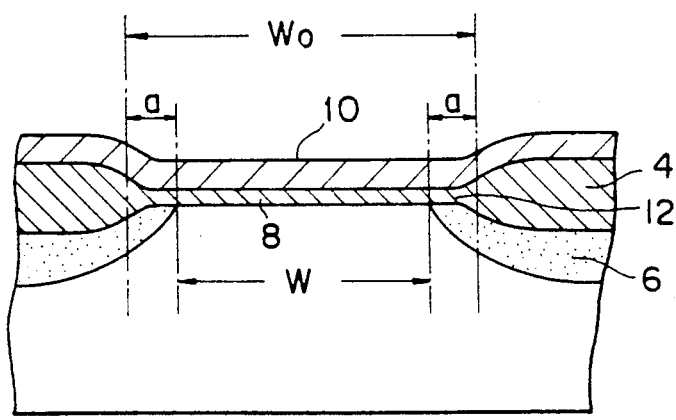

Typically, in a MOS transistor, controlling the level of current flowing between the source and drain regions is carried out by controlling the channel width using a field oxide layer. FIGS. 9a and 9b show schematically the overall structure of a typical MOS transistor. FIG. 9a is a plan view and FIG. 9b is a cross sectional view along line A-B indicated in FIG. 9a. As shown in FIG. 9a, the MOS transistor includes diffusion regions 2 formed in a semiconductor substate and a gate electrode 10 formed above the substrate. An upper diffusion region 2S defines a source and a lower diffusion region 2D defines a drain of the MOS transistor. As shown in FIG. 9b, the width of a channel of this MOSFET is indicated by W. Of importance, the channel width W in this structure is determined by a pair of oppositely located field oxide layers 4.

According to a typical prior art manufacturing method, after carrying out an ion implantation step for the formation of a device isolation field doping region or channel stop 6 in the substrate, the field oxide layer 4 is formed. Because of the heat produced at the time of formation of the field oxide layer 4, the field doped region 6 diffuses. At the same time, a laterally extending growth portion 12 of the field oxide layer 4, which is often called "bird's beak", is also formed. As shown in FIG. 9b, a gate oxide film 8 is formed on the active region of the substate. Because of the diffusion of the field doped layer 6 and also the formation of the bird's beak portion 12, the actual width W of a resulting channel tends to be smaller than a design channel width $W_0$ by a size a at each side. The size of reduction a varies depending on the conditions of manufacturing process and it is in the order of 1 to 3 microns.

In this manner, if the channel width W is desired to be controlled by the edge of the field oxide layer 4, fluctuations appear between the designed channel width $W_0$ and the actual channel width W, so that it will be difficult to control the channel width accurately. In addition, a multilevel MOS transistor may be fabricated by varyingly setting the channel width W. In this case, if the channel width W is to be varyingly set by the edge of the field oxide layer 4 as in the prior art, then the step of controlling the channel width must be carried out prior to the formation of the channel. This is not advantageous because the process conditions must be carefully considered each time when some modifications are to be introduced, even if they are minor.

In accordance with this aspect of the present invention, there is provided a MOS transistor having a structure in which the level of current flowing between its drain and source regions can be controlled, and which can be easily manufactured because the control of current level can be carried out after formation of the channel. In order to attain such an object, there is provided a MOS transistor having a channel region in which an impurity implanted region for preventing the occurrence of polarity inversion is formed at least partly. The implantation of impurities is preferably carried out by ion implantation. By varying the size of such an impurity implanted region, there is provided a multilevel MOS transistor having one of a predetermined number of states and suitable for use in a multilevel semiconductor memory device.

Figure 4A:
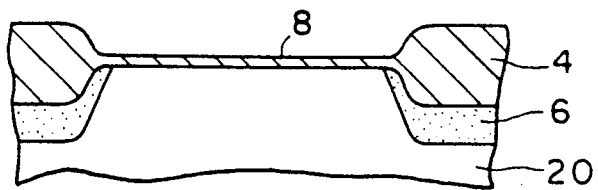
FIGS. 4a through 4e are schematic cross sectional views showing steps in a process for manufacturing a MOSFET having a width adjusted channel in accordance with one embodiment of the present invention.
Figure 4B:
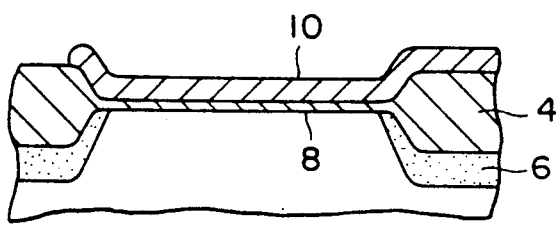
Figure 4C:
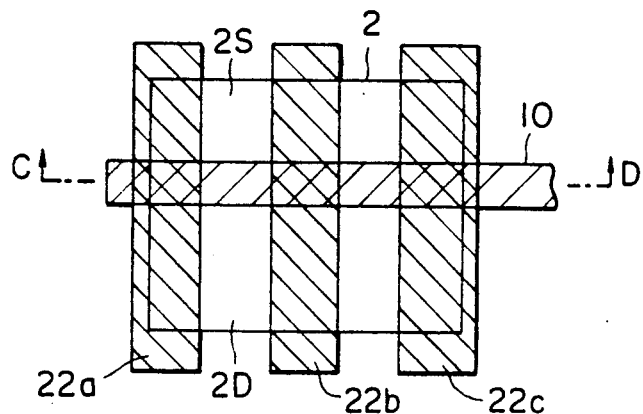

Referring now to FIGS. 4a through 4e, a method for manufacturing a MOS transistor in accordance with one embodiment of the present invention will be described in detail below. As shown in FIG. 4a, there is prepared a semiconductor structure including a P− substrate 20 of a semiconductor material, in which a field doped region 6 and a field oxide layer 4 are formed according to any one of the well known methods. A gate oxide film 8 is also formed on an active surface of the substrate 20, which is defined by the edge of the field oxide layer 4. Then, as shown in FIG. 4b, a gate electrode 10 is formed on the gate oxide film 8, for example, from polysilicon, and, preferably, using this gate electrode 10 as a mask, a pair of self-aligned source and drain regions (not shown in FIG. 4b) is formed in the substate 20 by diffusion or any other appropriate methods. Then, as shown in FIG. 4c, boron (B) implanting regions 22a–22c are defined in the channel region. Preferably, the boron ions are implanted at an energy of 160 KeV with the dose on the order of $5 \times 10^{13}$ ions/cm$^2$. In FIG. 4c, the diffusion regions are indicated by the reference numeral 2 and the source and drain regions are indicated by 2S and 2D, respectively.

Figure 4D:
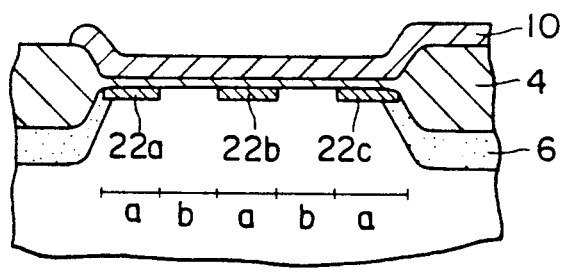
Figure 4E:
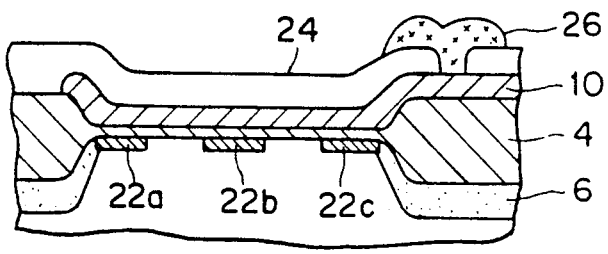

FIG. 4d is a cross sectional view taken along line C-D indicated in FIG. 4c. In the boron implanted regions 22a–22c, no polarity inversion takes place even if a voltage of 5 V is applied to the gate electrode 10. Thus, across the width of the channel shown in FIG. 4d, no transistor action takes place in those regions indicated by a, where boron ions have been implanted; on the other hand, in those regions indicated by b and thus masked when boron ions were implanted into regions a, there occurs polarity inversion with the application of an operating voltage to the gate electrode 10, so that a regular MOS transistor action can be expected. As a result, the transistor having the structure shown in FIG. 4d may be considered to have the effective channel width corresponding to a sum of the non-implanted regions b. Thus, the amount or level of current flowing between the source and drain regions 2S and 2D can be controlled by controlling the collective width of the non-implanted regions b. Then, as shown in FIG. 4e, an insulating film 24 is formed on the gate electrode 10, and, then, after formation of a contact hole in the insulating film 24, aluminum interconnect 26 is formed on the insulating film 24 to be in contact with the gate electrode 10.

Figure 5:
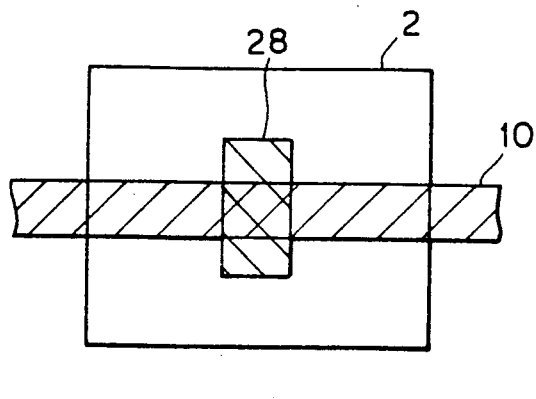
FIGS. 5, 6, 7a, 7b and 8 are schematic illustrations showing several examples of adjusting the width of a channel by providing an ion implanted region based on the principle of the present invention.
Figure 6:
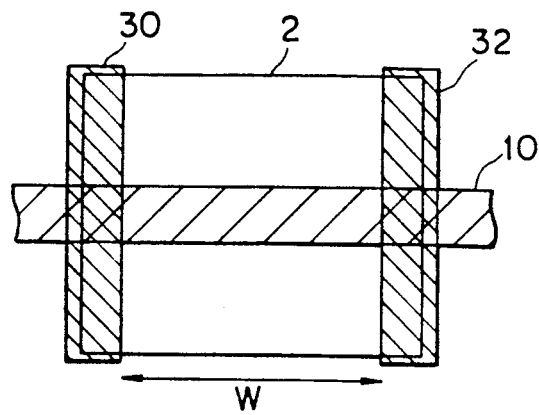

FIGS. 5 through 8 show several examples of polarity inversion preventing implanted regions formed in accordance with this aspect of the present invention. FIG. 5 illustrates one of the simplest examples, in which an inversion preventing region 28 is defined at the center of the channel by implanting impurity ions of the conductivity type which is opposite to the conductivity type of the source and drain regions 2. FIG. 6 illustrates an example in which a pair of inversion preventing regions 30 and 32 is formed along the opposite edges of the field oxide layer 4, or the boundaries between the active region 2 and the field oxide layer 4. In this structure, since the pair of inversion preventing regions 30 and 32 corresponds to those areas where a bird's beak of the field oxide layer 4 is formed and the lateral diffusion of the field doped region takes place, the effects of these bird's beak of the field oxide layer and lateral diffusion of the field doped region can be significantly reduced or eliminated. Typically, the deviation of the actual channel width W from the designed channel width $W_0$ can be reduced to $\frac{1}{3}$ to 1/10 as compared with the before-mentioned prior art technique.

For example, in the case where a relatively high accuracy in the value of resistance and the amount of current to be supplied is required in a device such as an analog circuit, it is preferable to form such a pair of inversion preventing regions 30 and 32 at the boundary between the diffusion region 2 and the field oxide layer 4 because there can be obtained a MOS transistor which is relatively high in accuracy and which has a channel width substantially close to the designed value.

Figure 7A:
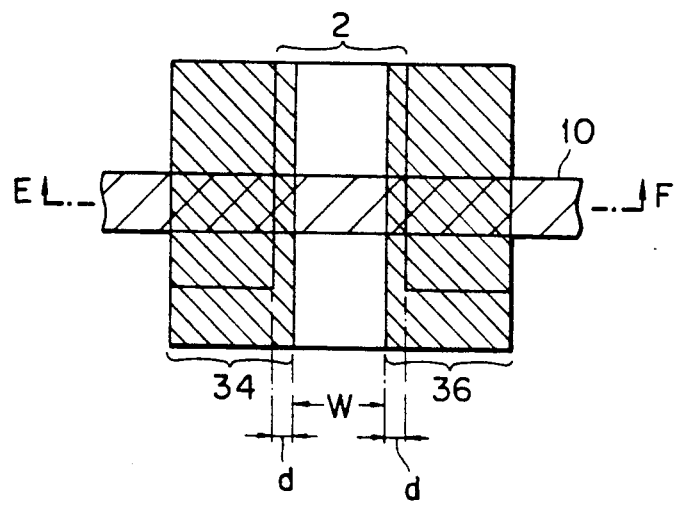

As pointed out previously, this aspect of the present invention is advantageous because it can be utilized to fabricate a multilevel MOS transistor suitable for use in a multilevel semiconductor memory device. FIG. 7a shows the case in which this aspect of the present invention has been applied to the formation of a multilevel MOS transistor. As shown in FIG. 7a, the diffusion region 2 is defined by the edge of the field oxide layer 4, and a pair of inversion preventing regions 34 and 36 is formed by ion implantation as indicated by shaded areas. In this case, each of the regions 34 and 36 is so defined to extend into the diffusion region 2 over a distance d. Thus, by changing this distance d, the channel width W can be varyingly set. Since the channel width W is set varyingly, the amount of current flowing between the source and drain regions can be set varyingly. Accordingly, there is provided a multilevel MOS transistor whose state (current level) can be appropriately set among a plurality of predetermined possible states.

Figure 7B:
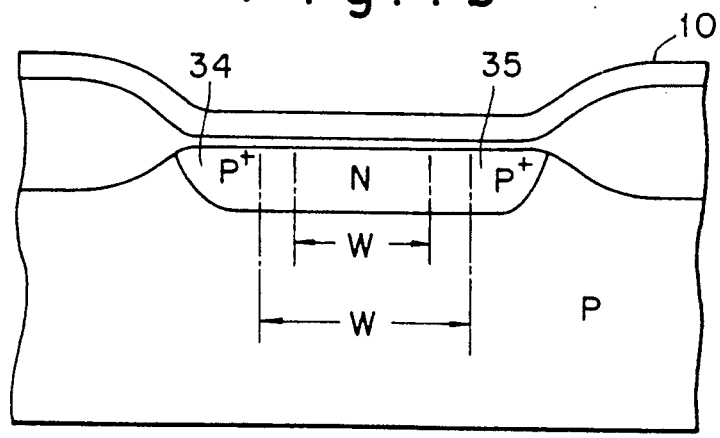
Figure 10A:
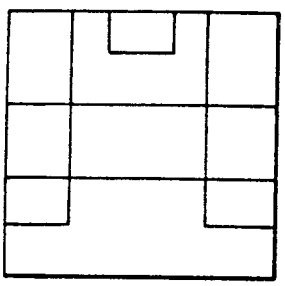
FIGS. 10a through 10d are schematic illustrations showing how to define one of four predetermined states by adjusting the width of a MOSFET channel in accordance with the principle of the present invention.
Figure 10B:
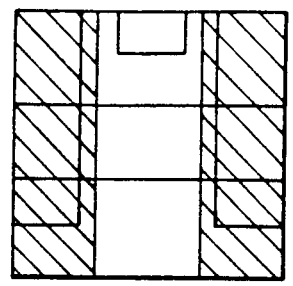
Figure 10C:
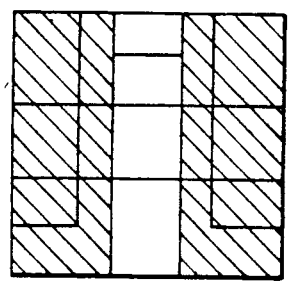
Figure 10D:
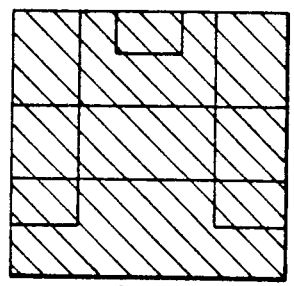
Figure 10D:
Figure 11:
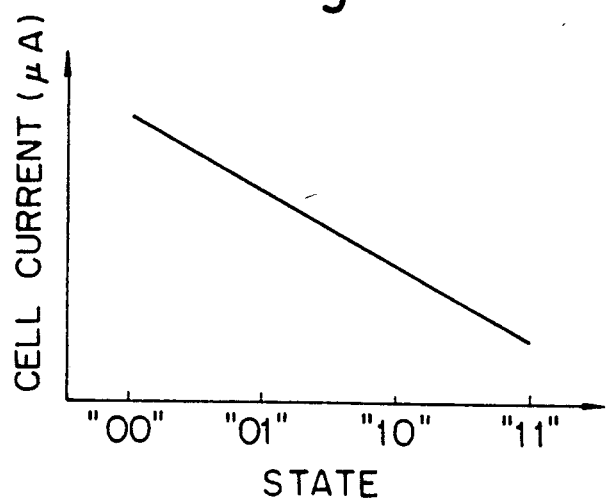
FIG. 11 is a graph which is useful for understanding how each of the four states is defined by each of the four structures illustrated in FIGS. 10a through 10d.

In forming a four level MOS transistor which can have one of four possible states or current levels, impurity ions having the conductivity type opposite to that of the diffusion regions can be implanted into the channel region varyingly. For example, in one embodiment, a first state may be defined by leaving the channel region not implanted as shown in FIG. 10a, a second state may be defined by implanting the channel region slightly as shown in FIG. 10b, and a third state may be defined by implanting the channel region substantially as shown in FIG. 10c. And, a fourth state may be defined by implanting the entire channel as shown in FIG. 10d. It is to be noted that the implanted and thus inversion preventing regions are indicated by shaded areas in FIGS. 10a through 10d which define four different states "00", "01", "10" and "11", respectively. FIG. 11 shows the relation between the current level and the state of the four-level MOS transistor. In addition, FIG. 7b shows in cross section how the channel width W is varyingly set by changing the size of the pair of inversion preventing regions 34 and 35 at the opposite boundaries between the diffusion region and the field oxide layer.

Figure 8:
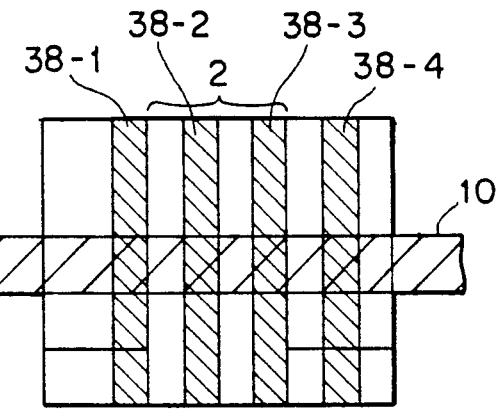

FIG. 8 shows another example of application of the present invention to a multilevel MOS transistor. In accordance with this embodiment, a plurality of stripe-shaped inversion preventing regions 38-1 through 38-4, which all have the same width and are arranged in parallel, are provided in the diffusion region 2. It is to be noted that the diffusion region 2 is, in fact, an upper region defining a drain/source region located above the gate electrode 10 as seen in FIG. 8 and a lower region defining the other drain/source region located below the gate electrode 10. Thus, the channel is defined below the gate electrode 10 and is located between these pair of drain/source regions. It will be easily understood that the current level or state of such a MOS transistor can be set by varying the number of stripes 38 in the diffusion region 2.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A sense circuit comprising:
   at least one multilevel memory transistor having one of at least first and second possible memory states which are identifiable by respective first and second levels of current flowing therethrough, respectively, said at least one memory transistor including a first terminal for receiving a first activation signal, a second terminal connected to a first node and a third terminal connected to a first reference potential;
   at least a pair of first and second reference transistors which pass current having said first and second levels, respectively, under the same biasing condition as that of said memory transistor, each of said reference transistors including a first terminal for receiving a second activation signal, a second terminal connected to a second node and a third terminal connected to said first reference potential;
   first current supplying means connected between said first node and a second reference potential for supplying a predetermined amount of current to said memory transistor when said first activation signal is supplied; and
   second current supplying means connected between said second node and said second reference potential and also connected to said first current supplying means for supplying approximately twice said predetermined amount of current to said reference transistors when said second activation signal is supplied.

2. The sense circuit of claim 1 wherein said first current supplying means includes: a first MOS transistor having a first source/drain connected to said first node and a second source/drain connected to a third node and including a gate; a first inverter having an output connected to said gate of said first transistor and an input connected to said first node; and a second MOS transistor having a first source/drain connected to said third node, a second source/drain connected to said second reference potential and a gate connected to said third node.

3. The sense circuit of claim 2 wherein said second current supplying means includes: a third MOS transistor having a first source/drain connected to said second node and a second source/drain connected to a fourth node and including a gate; a second inverter having an output connected to said gate of said third transistor and an input connected to said second node; and a pair of fourth and fifth MOS transistors, having a first source/drain connected to said fourth node, a second source/drain connected to said second reference potential and a gate connected to said third node.

4. The sense circuit of claim 3 wherein said first reference potential is ground potential and said second reference potential is a power supply potential.

5. The sense circuit of claim 4 wherein each of said memory and reference transistors is an MOS transistor.

6. The sense circuit of claim 4 wherein said first and third MOS transistors and N-channel MOSFETs.

7. The sense circuit of claim 6 wherein said second, fourth and fifth MOS transistors are all P-channel MOSFETs having substantially the same transistor characteristics.

* * * * *